(12) United States Patent
Aoki et al.

(10) Patent No.: US 12,354,983 B2
(45) Date of Patent: Jul. 8, 2025

(54) FINE-PITCH JOINING PAD STRUCTURE (71) Applicant: International Business Machines Corporation, Armonk, NY (US)

(72) Inventors: Toyohiro Aoki, Yokohama (JP); Koki Nakamura, Kawasaki (JP); Takashi Hisada, Hachiouji (JP)

(73) Assignee: International Business Machines Corporation, Armonk, NY (US)

( * ) Notice: Subject to any disclaimer, the term of this patent is extended or adjusted under 35 U.S.C. 154(b) by 541 days.

(21) Appl. No.: 17/657,162

(22) Filed: Mar. 30, 2022

(65) Prior Publication Data

US 2023/0317652 A1    Oct. 5, 2023

(51) Int. Cl.
*H01L 23/00* (2006.01)
(52) U.S. Cl.
CPC .............. *H01L 24/08* (2013.01); *H01L 24/03* (2013.01); *H01L 24/05* (2013.01); *H01L 24/09* (2013.01); *H01L 24/11* (2013.01); *H01L 24/13* (2013.01); *H01L 24/16* (2013.01); *H01L 24/73* (2013.01); *H01L 24/32* (2013.01); *H01L 2224/03015* (2013.01); *H01L 2224/05552* (2013.01); *H01L 2224/05557* (2013.01); *H01L 2224/08053* (2013.01); *H01L 2224/08059* (2013.01); *H01L 2224/09055* (2013.01); *H01L 2224/09133* (2013.01); *H01L 2224/11848* (2013.01); *H01L 2224/13014* (2013.01); *H01L 2224/16059* (2013.01); *H01L 2224/16148* (2013.01); *H01L 2224/32145* (2013.01); *H01L 2224/73204* (2013.01)

(58) Field of Classification Search
CPC ..................................................... H01L 24/08
See application file for complete search history.

(56) References Cited

U.S. PATENT DOCUMENTS 7,547,625 B2 * 6/2009 Beyne ..................... H01L 25/50
438/615
9,508,594 B2   11/2016 Aoki
(Continued)

FOREIGN PATENT DOCUMENTS

| CN | 103681556 A | 3/2014 |
| CN | 111199946 A | 5/2020 |

(Continued)

OTHER PUBLICATIONS

Derwent Publication of JP 2010177258 (Year: 2010).*

(Continued)

*Primary Examiner* — William A Harriston
(74) *Attorney, Agent, or Firm* — Kimberly Zillig (57) ABSTRACT

A semiconductor device includes two integrated circuit (IC) chips. The first IC chip includes substrate, a spacer connected to the substrate and including holes, wherein at least one of the holes has a first shape, and solder bumps positioned in the holes, respectively. The second IC chip includes a substrate, electrode pads extending from the substrate and connected to the solder bumps, respectively. At least one of the electrode pads that corresponds to the at least one of the solder bumps has a second shape, and the first shape and the second shape are non-coextensive such that there is at least one gap between the first shape and the second shape when projected on each other.

24 Claims, 9 Drawing Sheets

(56) References Cited

U.S. PATENT DOCUMENTS

| | | | |
|---|---|---|---|
| 10,598,874 B2 | 3/2020 | Aoki | |
| 10,615,143 B2* | 4/2020 | Aoki | B23K 3/0623 |
| 10,797,011 B2 | 10/2020 | Aoki | |
| 2006/0292824 A1* | 12/2006 | Beyne | H01L 25/50 |
| | | | 257/E21.705 |
| 2008/0093749 A1* | 4/2008 | Gerber | H01L 23/49816 |
| | | | 257/784 |
| 2010/0225001 A1* | 9/2010 | Hizume | H01L 24/29 |
| | | | 257/773 |
| 2013/0307144 A1* | 11/2013 | Yu | H01L 25/0657 |
| | | | 257/737 |
| 2015/0001706 A1 | 1/2015 | Mirpuri | |
| 2016/0056116 A1* | 2/2016 | Aoki | H01L 24/29 |
| | | | 438/614 |
| 2016/0276315 A1* | 9/2016 | Chen | H01L 24/05 |

FOREIGN PATENT DOCUMENTS

| | | |
|---|---|---|
| CN | 113314428 A | 8/2021 |
| JP | 2006294761 A | 10/2006 |
| JP | 2010177258 A * | 8/2010 |

OTHER PUBLICATIONS

International Search Report and Written Opinion dated Jun. 28, 2023, for International Application No. PCT/IB2023/051508, filed Feb. 19, 2023.

Aoki, et al., "Novel Low Cost Bumping Process with Non-strip Type Photosensitive Resin and Injection Molded Solder (IMS) for Fine Pitch Flip Chip Joining." Published Aug. 18, 2016 by IEEE. 7 pages. In 2016 IEEE 66th Electronic Components and Technology Conference (ECTC). DOI: 10.1109/ECTC.2016.339.

Nakamura et al., "Double Resist Structure for Electrodeposition Bonding," U.S. Appl. No. 17/588,404, filed Jan. 31, 2022.

* cited by examiner

FINE-PITCH JOINING PAD STRUCTURE

BACKGROUND

The present disclosure relates to semiconductor devices, and more specifically, to structures and methods for joining computer chip assemblies together.

Transistors for computing continue to get smaller as the technology to manufacture them improves. This can allow for integrated circuit (IC) chips to also shrink in size correspondingly. To take advantage of the opportunity for increased computing density, the packaging for integrated circuit chips can include input/output connections that are closer together than in the past. However, as the space between the electrical joints is reduced, the possibility for short circuit connections between contacts that are intended to be separate increases. Such defects and flaws can increase the scrap ratio of production, which decreases the efficiency of the manufacturing process.

SUMMARY

According to one embodiment of the present disclosure, a semiconductor device includes two integrated circuit (IC) chips. The first IC chip includes substrate, a spacer connected to the substrate and including holes, wherein at least one of the holes has a first shape, and solder bumps positioned in the holes, respectively. The second IC chip includes a substrate, electrode pads extending from the substrate and connected to the solder bumps, respectively. At least one of the electrode pads that corresponds to the at least one of the solder bumps has a second shape, and the first shape and the second shape are non-coextensive such that there is at least one gap between the first shape and the second shape when projected on each other.

According to one embodiment of the present disclosure, a semiconductor device includes two IC chips. The first IC chip includes a substrate, a spacer connected to the substrate and including holes, wherein at least one of the holes has a first shape, and solder bumps positioned in the holes, respectively. The second IC chip includes a substrate, electrode pads extending from the substrate and connected to the solder bumps, respectively. At least one of the electrode pads that corresponds to the at least one of the solder bumps has a second shape, and the first shape and the second shape are non-coextensive such that there is at least one discontinuous lap between the first shape and the second shape when projected on each other.

According to one embodiment of the present disclosure, an IC chip includes a substrate and electrode pads extending from the substrate and configured to be connected to a plurality of solder bumps on another IC chip, respectively. At least one of the electrode pads has a pad periphery that is configured to be non-coextensive with its corresponding one of the solder bumps that has a bump periphery such that there is at least one gap between the pad periphery and the bump periphery when projected on each other, and there is at least one discontinuous lap between the pad periphery and the bump periphery when projected on each other.

According to one embodiment of the present disclosure, a method of making a semiconductor device includes forming a substrate, electrode, and a passivation layer of a first IC chip, forming a metal layer on the passivation layer and the electrode, forming a seed on the metal layer, and forming a cap on the seed to form a pad that is configured to be connected to a solder bump of a second IC chip. A periphery of the pad is non-coextensive with a periphery of the solder bump such that there is at least one gap between the periphery of the pad and the periphery of the solder bump when projected on each other, and there is at least one discontinuous lap between the periphery of the pad and the periphery of the solder bump when projected on each other.

According to one embodiment of the present disclosure, a method of making a semiconductor device includes forming a substrate of a first IC chip, wherein the substrate includes a protruding seed, forming an electrode on the substrate, including the seed, forming a passivation layer on the substrate and on the electrode, forming a metal layer on the passivation layer and the electrode, and forming a pad on the electrode that is configured to be connected to a solder bump of a second IC chip. A periphery of the pad is non-coextensive with a periphery of the solder bump such that there is at least one gap between the periphery of the pad and the periphery of the solder bump when projected on each other, and there is at least one discontinuous lap between the periphery of the pad and the periphery of the solder bump when projected on each other.

DETAILED DESCRIPTION

Various embodiments of the present disclosure are described herein with reference to the related drawings.

Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising," "includes," "including," "has," "having," "contains," or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing Figures. The terms "overlying," "atop," "on top," "positioned on," or "positioned atop" mean that a first element, such as a first structure, is present on a second element, such as a second structure, wherein intervening elements such as an interface structure can be present between the first element and the second element.

Figure 1:
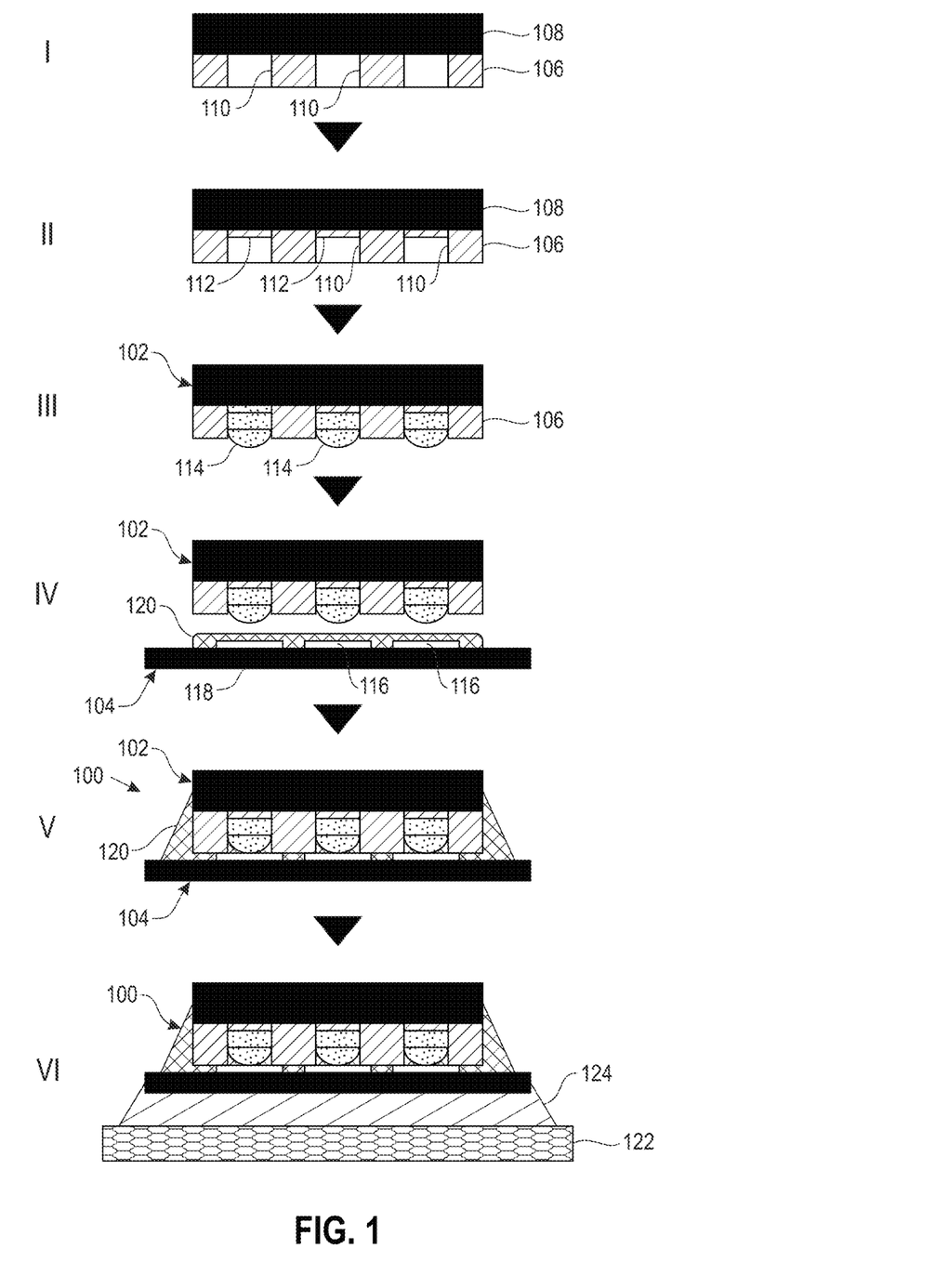
FIG. 1 is a series of side views of making a semiconductor device that includes a top IC chip being joined with a bottom IC chip, in accordance with an embodiment of the present disclosure.

FIG. 1 is a series of side views I-VI of making semiconductor device 100 that includes top integrated circuit (IC) chip 102 being joined with bottom IC chip 104. In view I, spacer 106 has been formed on substrate 108. Spacer 106 is a permanent photoresist layer/mask that is made of, for example, polymer and includes a plurality of holes 110. In view II, a plurality of conductors 112 has been formed on substrate 108 inside holes 110. Conductors 112 can be an electrically conductive material such as, for example, nickel. In view III, a plurality of solder bumps 114 has been formed on conductors 112 inside holes 110 to form top IC chip 102. In addition, each of the plurality of solder bumps 114 extends beyond spacer 106 and have been formed by an injection molded solder (IMS) process.

In view IV, top IC chip 102 has been placed near bottom IC chip 104. Bottom IC chip 104 includes a plurality of electrode pads 116 formed on substrate 118. In addition, non-conductive paste (NCP) 120 sits atop electrode pads 116 and substrate 118. NCP 120 is a low viscosity liquid that acts as a flux material and adheres top IC chip 102 to bottom IC chip 104. In view V, top IC chip 102 has been forced against bottom IC chip 104 (e.g., with a magnitude of between 5 Newtons (N) and 20 N) so that spacer 106 contacts electrode pads 116. In addition, solder bumps 114 are heated to soften or melt solder bumps 114. Thereby, solder bumps 114 have displaced NCP 120 and have been soldered to electrode pads 116, respectively, to form semiconductor device 100. In view VI, laminate 122 has been affixed to semiconductor device 100 using underfill 124 to create a packaged device.

The components and configuration of semiconductor device 100 allow for top IC chip 102 to be electrically and structurally connected with bottom IC chip 104. This can occur even if the pitch of the connections is fine (i.e., the spacing between solder bumps 114/electrode pads 116 is small, for example, between 80 micrometers (μm) and 40 μm (or smaller)), which is beneficial due to the higher bandwidth provided thereby.

Figure 2A:
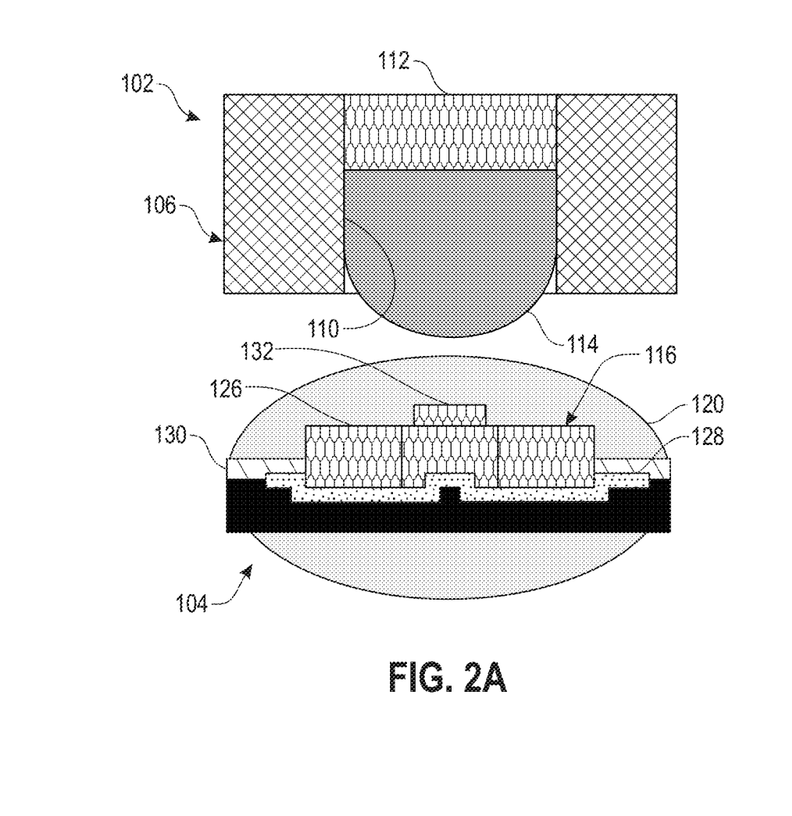
FIG. 2A is a side view of a solder bump on the top IC chip near an electrode pad of the bottom IC chip prior to joining, in accordance with an embodiment of the present disclosure.

FIG. 2A is a side view of solder bump 114 near electrode pad 116 prior to joining. Solder bump 114 and electrode pad 116 can be representative of any or all of the solder bumps 114 and electrode pads 116 in their respective arrays.

In the illustrated embodiment, electrode pad 116 comprises pad 126 and electrode 128. Electrode 128 is structurally connected to substrate 118 and passivation layer 130, and pad 126 is also structurally connected to passivation layer 130. In some embodiments, pad 126 includes protrusion 132 that extends from the majority of the upper surface towards solder bump 114. In other embodiments, pad 126 is flat on top and lacks protrusion 132.

Figure 2B:
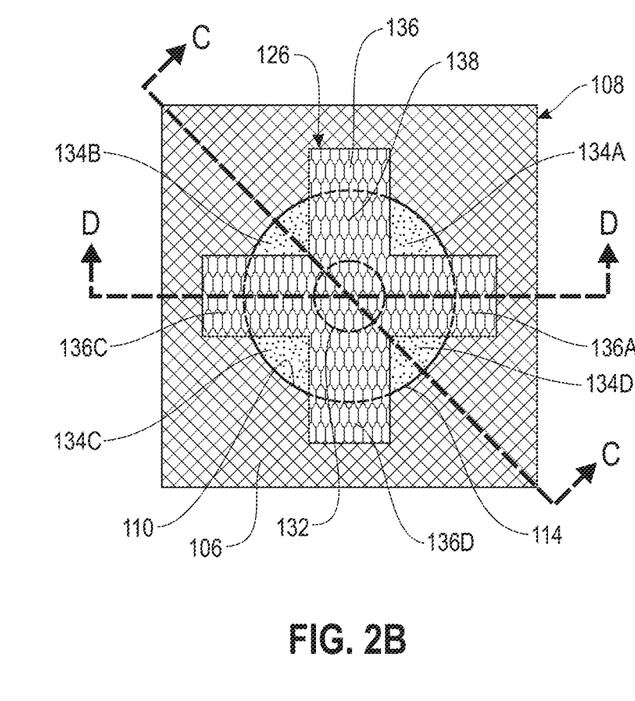
FIG. 2B is a bottom view indicated by line B-B in FIG. 2C of the top and bottom IC chips joined together, in accordance with an embodiment of the present disclosure.
Figure 2C:
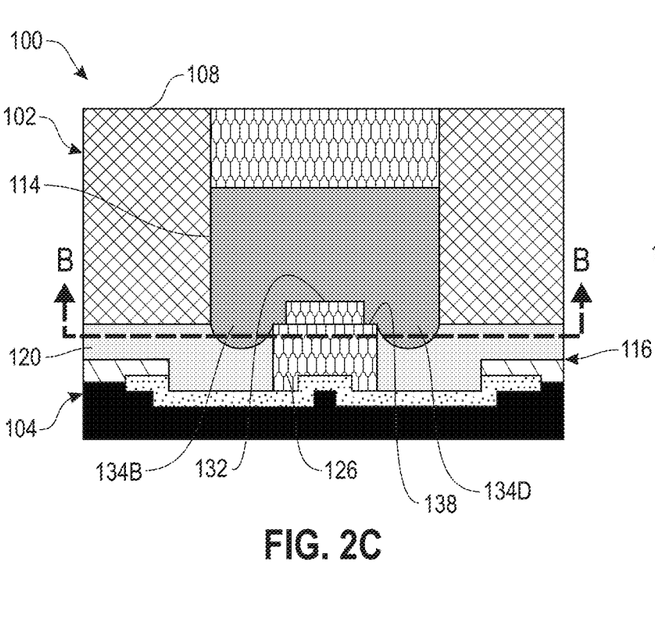
FIG. 2C is a cross-sectional view indicated by line C-C in FIG. 2B of the top and bottom IC chips joined together, in accordance with an embodiment of the present disclosure.

FIG. 2B is a bottom view indicated by line B-B in FIG. 2C of top IC chip 102 and bottom IC chip 104 joined together to form semiconductor device 100 (shown in FIG. 1). In the illustrated embodiment, solder bump 114 has a circular shape, although in other embodiments, solder bump 114 has a more rectangular or square shape. In addition, pad 126 has a plus-sign shape such that the shape of hole 110/solder bump 114 and the shape of pad 126 are non-coextensive. Thereby, gaps 134A-134D (collectively, "gaps 134") exist between spacer 106 and pad 126 as defined by the non-coextensive nature of the shape of hole 110/solder bump 114 and pad 126, where gaps 134 include an area across a primary face of hole 110 that is not covered by a projection of pad 126 made in the direction from bottom IC chip 104 to top IC chip 102 (i.e., the direction of the view of FIG. 2B). Thus, gaps 134 are bordered by the periphery of hole 110/solder bump 114 on the curved outer side and by pad 126 on the two straight inner sides In the illustrated embodiment, spacer laps 136A-136D (collectively, "spacer laps 136") exist where spacer 106 and pad 126 coextend (i.e., where a projection of pad 126 made in the direction from bottom IC chip 104 to top IC chip 102 covers spacer 106). There is also a bump lap 138 where solder bump 114 and pad 126 coextend (i.e., where a projection of pad 126 made in the direction from bottom IC chip 104 to top IC chip 102 covers solder bump 114). In some embodiments, spacer laps 136 are discontinuous laps from one another, and the periphery of bump lap 138 is discontinuous with respect to the periphery of solder bump 114 due to solder bump 114 and pad 126 being non-coextensive with each other. In other words, the outer perimeter of pad 126 coextends with the outer perimeter of solder bump 114 at some positions but not others because pad 126 has a plus-sign shape and solder bump 114 has a circular shape. Spacer laps 136 and bump lap 138 (collectively "laps") are to be understood to refer to regions where a projection of pad 126 made in the direction from bottom IC chip 104 to top IC chip 102 would cover a portion of top IC chip 102.

In some embodiments, protrusion 132 has an area that is between 5% and 25% of the area of hole 110/solder bump 114 (e.g., about 12%). In some embodiments, protrusion 132 has a height that is between 10% and 30% of the diameter of hole 110/solder bump 114 (e.g., about 20%). In some embodiments, the area of spacer laps 136 (combined) is between 10% and 50% of the area of hole 110/solder bump 114 (e.g., about 25%). In some embodiments, the area of gaps 134 (combined) is between 10% and 50% of the area of hole 110/solder bump 114 (e.g., about 25%).

FIG. 2C is a cross-sectional view indicated by line C-C in FIG. 2B of top IC chip 102 and bottom IC chip 104 joined together to form semiconductor device 100. In the illustrated embodiment, solder bump 114 has been soldered to electrode pad 116. To ensure an electrical connection therebetween, solder bump 114 can have an excess of material, and/or protrusion 132 can decrease the distance between solder bump 114 and pad 126. This can be beneficial in case of a manufacturing defect such as, for example, warpage, misalignment, sub-optimal heights of solder bumps 114 and/or electrode pads 116, or other tolerance stacking issues.

During the soldering process, protrusion 132 can spread the material from solder bump 114 across the top surface of pad 126 at bump lap 138. Simultaneously, during soldering, the excess material from solder bump 114 can escape through gaps 134 and past the top surface of pad 126, alongside the sides of pad 126, and towards substrate 118. Such a configuration prevents excess material from solder bump 114 from being forced laterally outward toward any adjacent solder bump 114/electrode pad 116 (which is called "bridging"). In some embodiments, given a pitch of 40 μm, the material from solder bump 114 would not extend beyond a square having sides of 30 μm that is centered on solder bump 114. Thereby, a short circuit connection can be avoided while still maximizing the size of the metal-to-metal contact, which reduces the electrical resistance through semiconductor device 100.

Figure 2D:
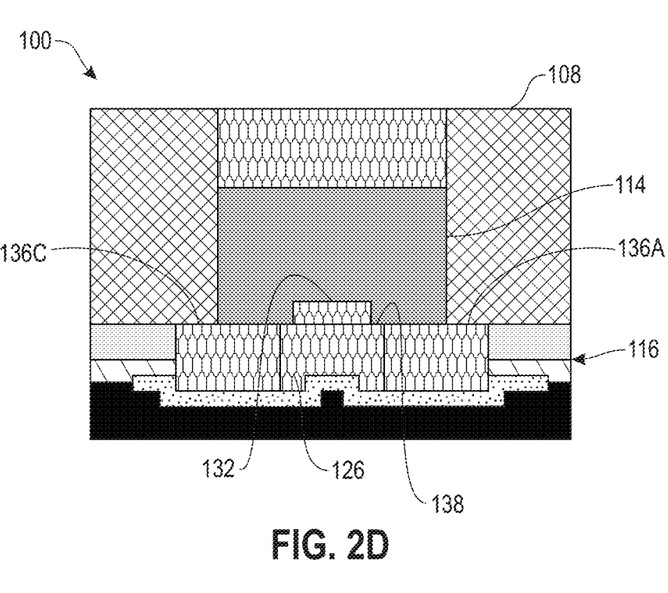
FIG. 2D is a cross-sectional view indicated by line D-D in FIG. 2B of the top and bottom IC chips joined together, in accordance with an embodiment of the present disclosure.

FIG. 2D is a cross-sectional view indicated by line D-D in FIG. 2B of top IC chip 102 and bottom IC chip 104 joined together to form semiconductor device 100. In the illustrated embodiment, pad 126 directly contacts spacer 106 at spacer laps 136. This prevents pad 126 from being pressed into hole 110 and displacing a substantial amount of excess material from solder bump 114. While spacer 106 is somewhat pliable, spacer laps 136 act as a soft stop during the assembly of semiconductor device 100. Thereby, the tolerance of allowable force is increased without increasing the risk of bridging (for example, up to 40 N).

Figure 3:
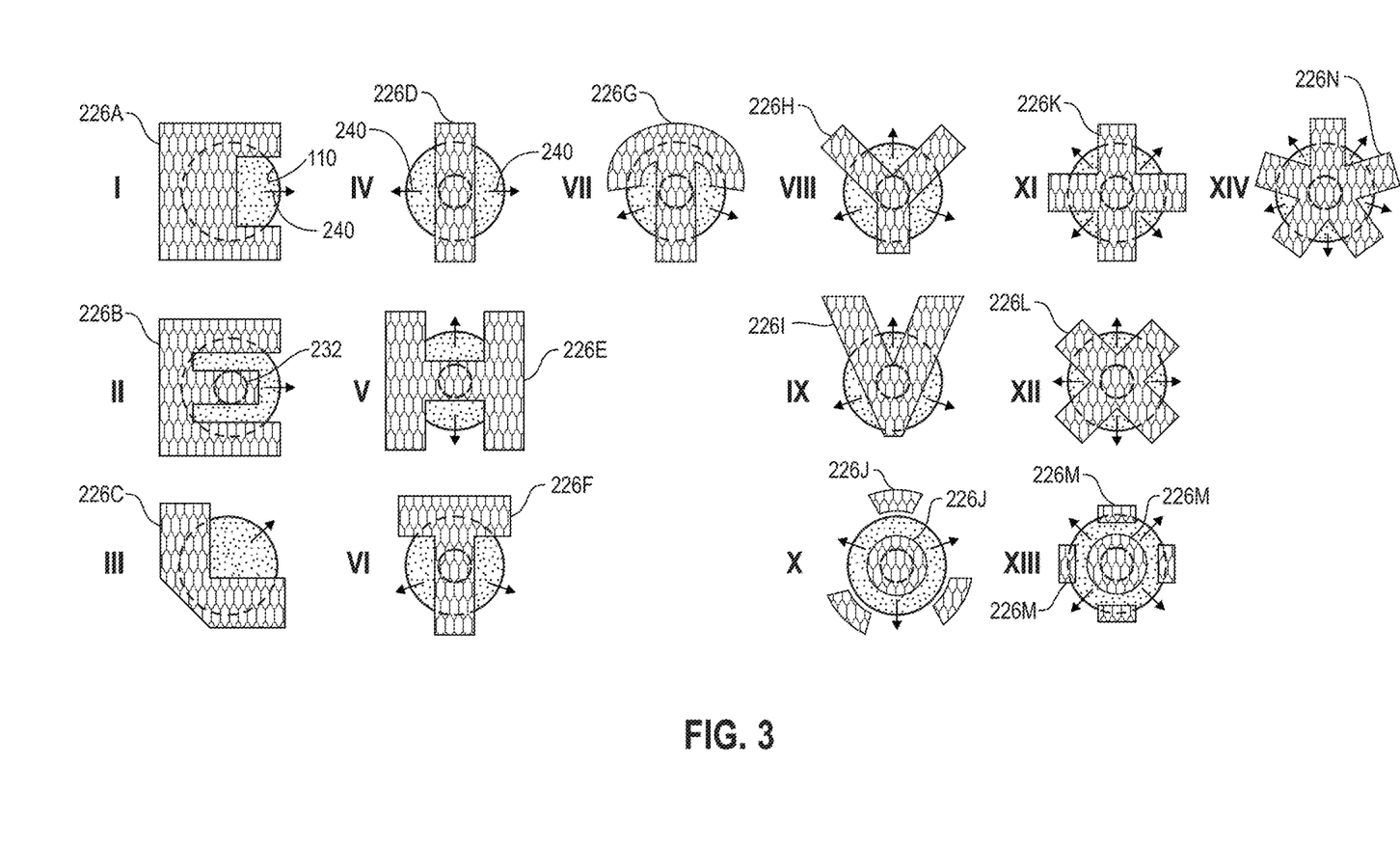
FIG. 3 is a series of cross-sectional views indicated by line B-B in FIG. 2C of the top IC chip and an alternative bottom IC chip joined together including alternative pads, in accordance with an embodiment of the present disclosure.

FIG. 3 is a series cross-sectional views I-XIV indicated by line B-B in FIG. 2C top IC chip 102 and bottom IC chip 204 joined together to form semiconductor device 200. There are some features of semiconductor device 200 that are substantially similar to or the same as those of semiconductor device 100 (shown in FIG. 1), so the reference numerals may be the same. There are some other features of semiconductor device 200 that are similar but substantially different as those of semiconductor device 100, so the reference numerals may be one hundred greater.

The illustrated embodiments of views I-XIV show some different configurations for pads 226A-226N (collectively "pads 226"). Views I-XIV include indicators 240 that show the direction(s) of escape of excess material from solder bump 114 (shown in FIG. 2D). Such escape directions are followed by heated, flowing solder when top IC chip 102 and bottom IC chip 104 are forced together in cases where the spaces beneath gaps 234 are inadequate to contain the excess material by themselves. In each pad 226, protrusion 232 is as centered as possible with respect to hole 110.

Pad 226A has a C shape, pad 226B has an E shape, and pad 226C has an L shape. In the illustrated embodiments, pad 226B has a protrusion 132, although pad 226A and 226C do not. Each of pads 226A-226C include a single escape direction. Pad 226D has an I shape, pad 226E has an H shape, pad 226F has a T shape, and pad 226G has an umbrella shape. Each of pads 226D-226G include two escape directions. Pad 226H has a Y shape, pad 226I has a V shape, and pad 226J has a radiation-symbol shape. Each of pads 226H-226J include three escape directions. Pad 226K has a plus-sign shape (which is the same as that of pad 126), pad 226L has an X shape (which is the same as that of pad 126 but rotated by forty-five degrees), and pad 226M has a Fresnel-lens shape. Each of pads 226K-226M include four escape directions. Pad 226N has an asterisk shape with includes five escape directions. While pads 226J and 226M have multiple discontinuous portions (four and five, respectively), each of pads 226J and 226M is connected to its respective electrode 128 (shown in FIG. 2A). Therefore, the conduction of electricity still generally follows the same route as that of the other pads 226.

Figure 4A:
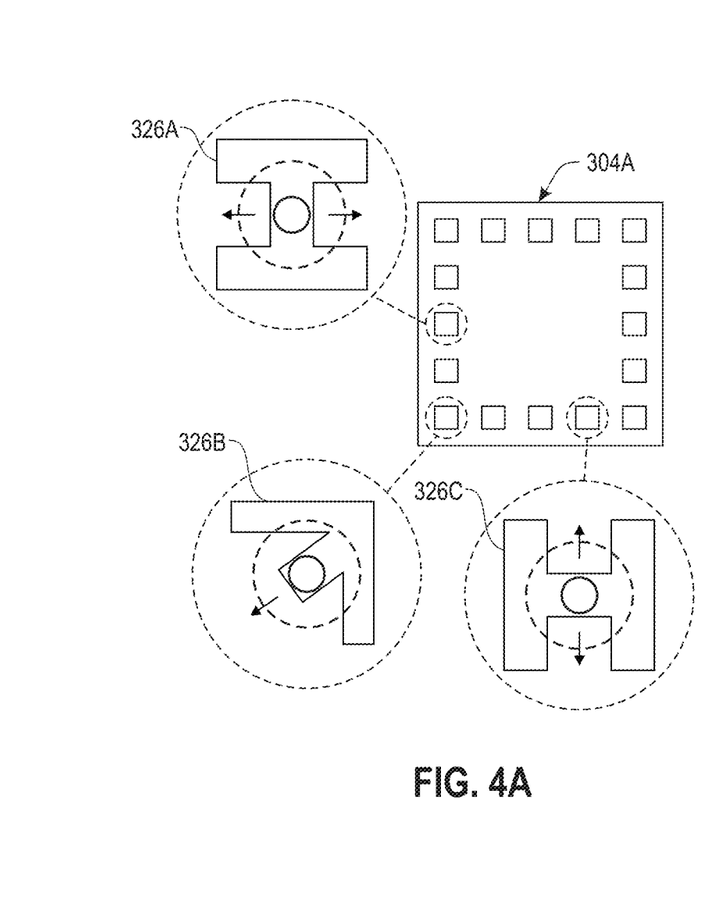
FIG. 4A is a top view of a bottom IC chip including varying embodiments of pads, in accordance with an embodiment of the present disclosure.

FIG. 4A is a top view of bottom IC chip 304A including varying embodiments of pads 326A-326C (collectively "pads 326") that have been strategically chosen and positioned. In the illustrated embodiment, bottom IC chip 304A has an arrangement wherein the pads are arranged in a single ring that is near the periphery of bottom IC chip 304A. Because excess solder material cannot form a bridge if it does not reach another connector, there are some directions for excess solder flow that would be more problematic than others. Therefore, pads 326 are configured such that their escape directions are not directed towards the adjacent pads. For example, the escape directions of pad 326A are east and west, not north and south (with respect to FIG. 4A), and the escape directions of pad 326C are north and south, not east and west. Because pad 326B has adjacent pads to the north and east, its escape direction is southwest, away from all the other pads.

Figure 4B:
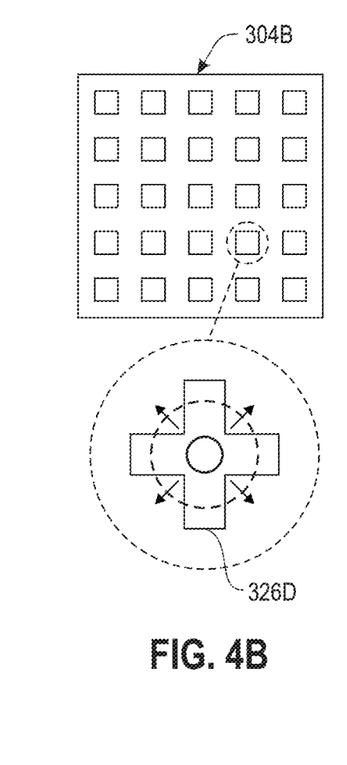
FIG. 4B is a top view of an alternative bottom IC chip including different pads from those in FIG. 4A, in accordance with an embodiment of the present disclosure.

FIG. 4B is a top view of alternative bottom IC chip 304B including different pads 326D from those in FIG. 4B that have been strategically chosen and positioned. In the illustrated embodiment, bottom IC chip 304B has an arrangement wherein the pads are arranged in a rectangular array across the entirety of bottom IC chip 304B. Therefore, pads 326D are configured such that their escape directions are not directed towards the adjacent pads. More specifically, the escape directions of pad 326D are northeast, northwest, southwest, and southeast (with respect to FIG. 4B) away from all the other pads 326D.

Figure 4C:
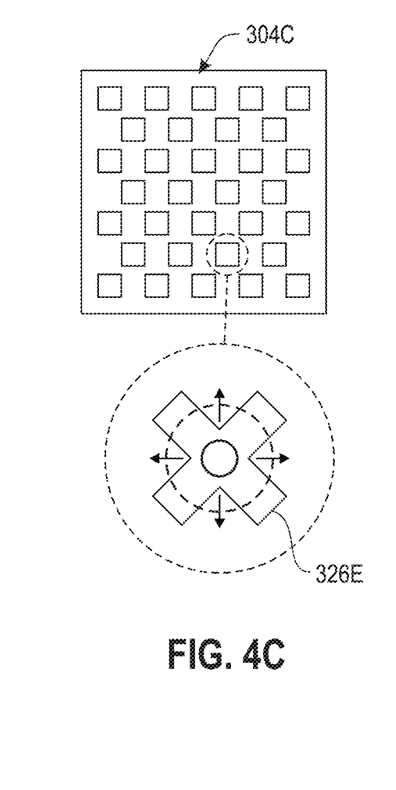
FIG. 4C is a top view of an alternative bottom IC chip including different pads from those in FIGS. 4A and 4B, in accordance with an embodiment of the present disclosure.

FIG. 4C is a top view of alternative bottom IC chip 304C including different pads 326E from those in FIG. 4C that have been strategically chosen and positioned. In the illustrated embodiment, bottom IC chip 304C has an arrangement wherein the pads are arranged in a staggered/diamond array across the entirety of bottom IC chip 304C. Therefore, pads 326E are configured such that their escape directions are not directed towards the adjacent pads. More specifically, the escape directions of pad 326E are east, west, north, and south (with respect to FIG. 4A) away from all the other pads 326E.

Figure 5:
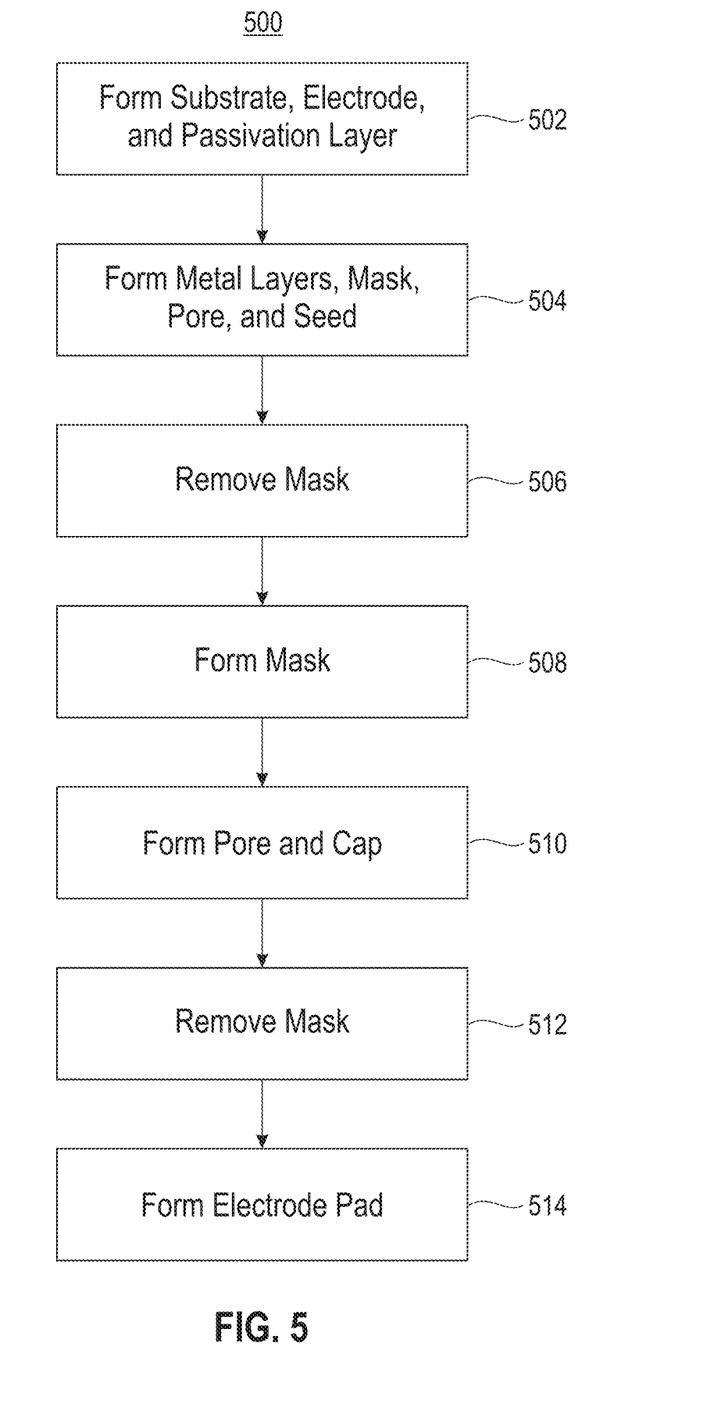
FIG. 5 is a flowchart of a method of manufacturing IC chip electrode pads, in accordance with an embodiment of the present disclosure.
Figure 6:
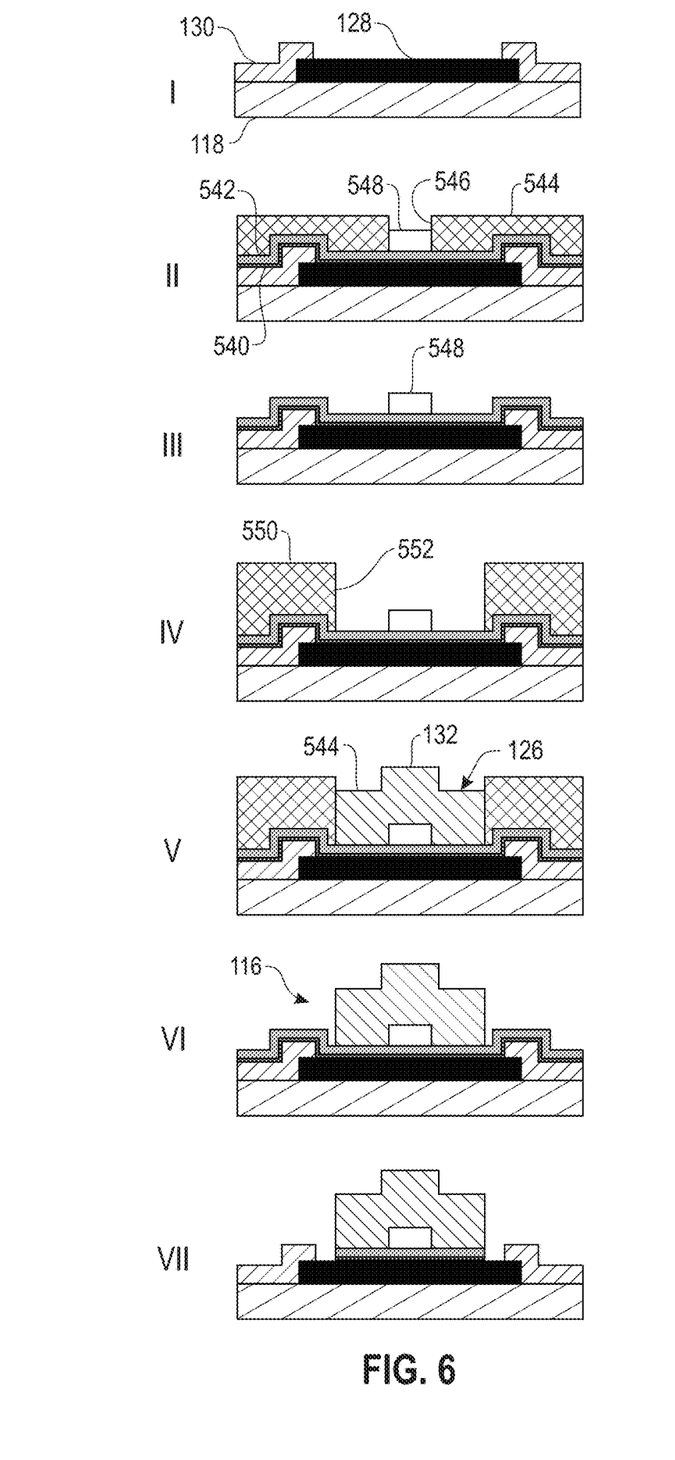
FIG. 6 is a series of cross-sectional views of the method of FIG. 5, in accordance with an embodiment of the present disclosure.

FIG. 5 is a flowchart of method 500 of manufacturing IC chip electrode pads 116. FIG. 6 is a series of cross-sectional views I-VII depicting the operations in method 500. FIGS. 5 and 6 will be discussed in conjunction with one another.

In the illustrated embodiment, method 500 starts at operation 502 wherein substrate 118, electrode 128, and passivation layer 130 are formed. At operation 504, metal layer 540 is formed on electrode 128 and passivation layer 130. Metal layer 542 is formed on metal layer 540, and mask 544 is formed on metal layer 542. In some embodiments, metal layer 540 and/or metal layer 542 are copper or nickel. Then, pore 546 is formed in mask 544 to expose metal layer 542, and a seed 548 that protrudes from metal layer 542 is formed on metal layer 542 inside pore 546. At operation 506, mask 544 is removed, and at operation 508, mask 550 is formed on metal layer 542 and seed 548.

In the illustrated embodiment, at operation 510, pore 552 is formed in mask 550 to expose seed 548 and metal layer 542. Then cap 554 is formed on seed 548 to form pad 126 that includes protrusion 132. In some embodiments, cap 554 is copper or nickel and can be the same material as seed 548. At operation 512, mask 550 is removed, and at operation 514, metal layers 540 and 542 are etched away to form electrode pad 116.

Figure 7:
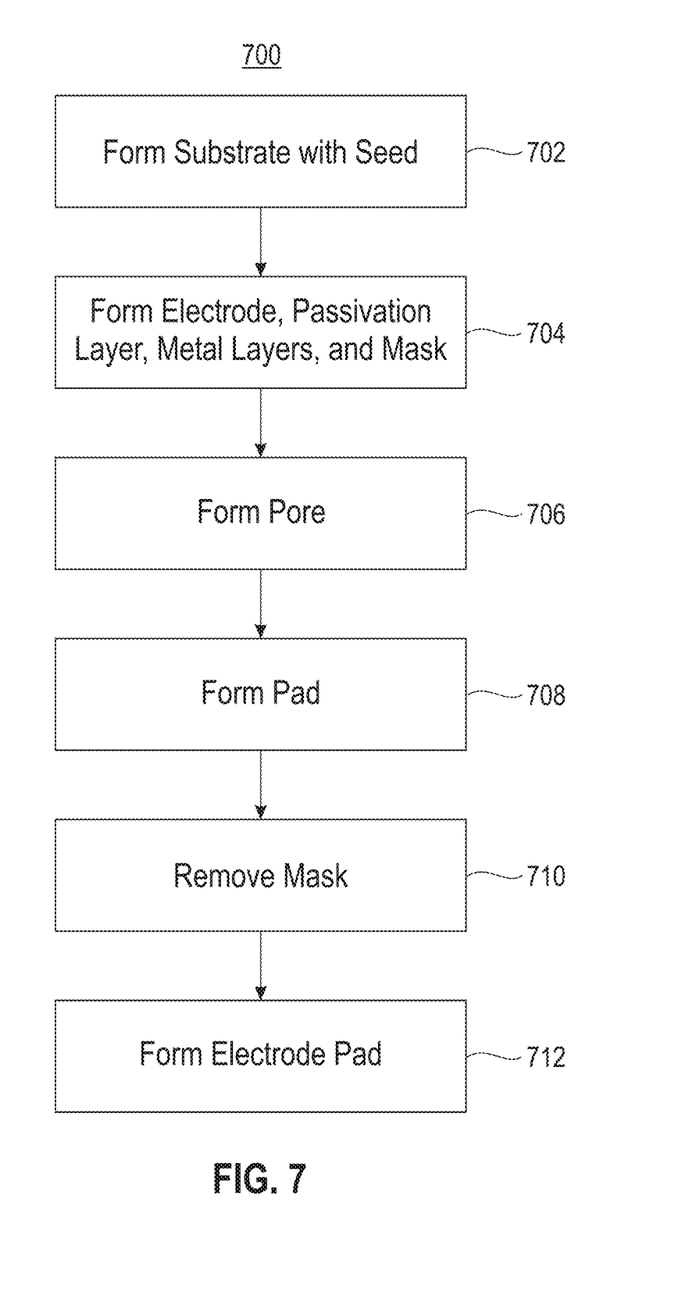
FIG. 7 is a flowchart of an alternative method of manufacturing IC chip electrode pads, in accordance with an embodiment of the present disclosure.
Figure 8:
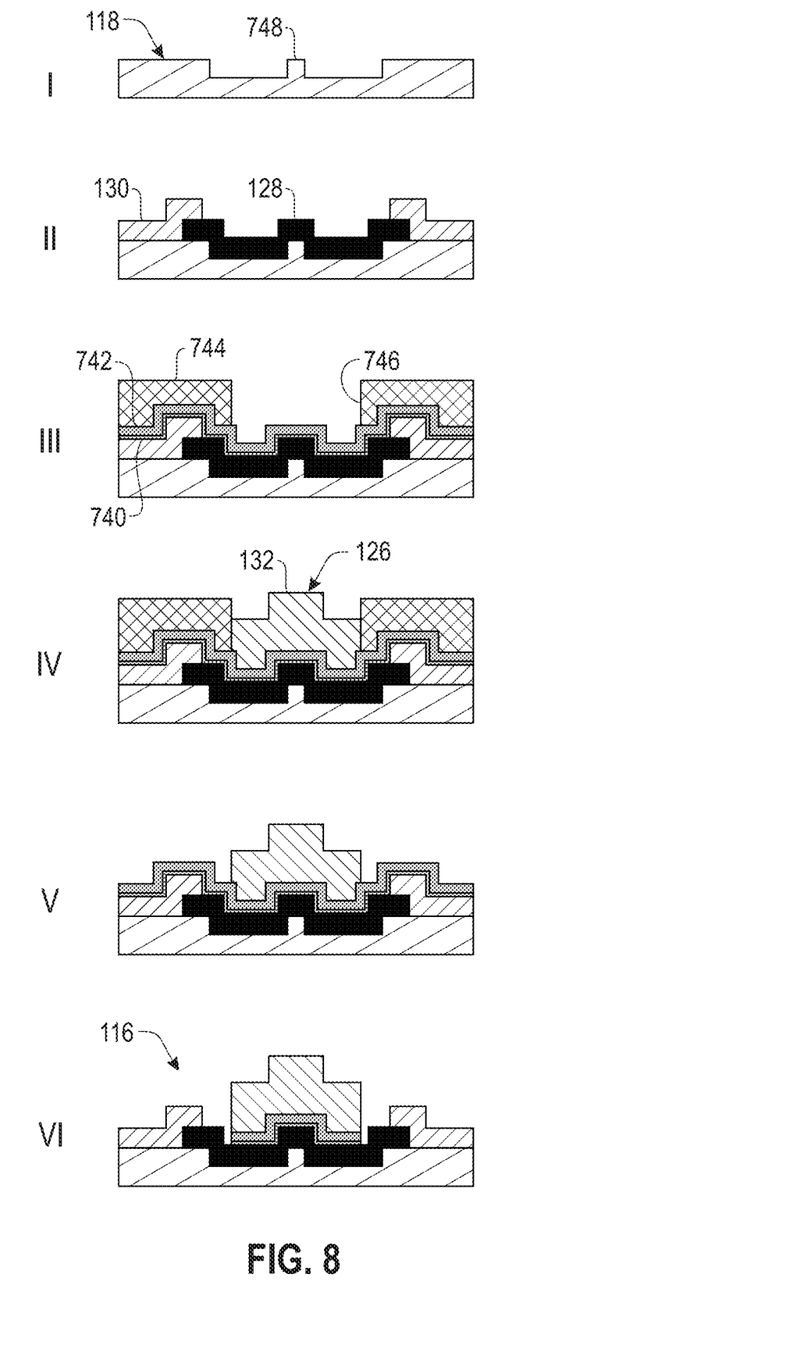
FIG. 8 is a series of cross-sectional views of the alternative method of FIG. 7, in accordance with an embodiment of the present disclosure.

FIG. 7 is a flowchart of an alternative method 700 of manufacturing IC chip electrode pads 116. FIG. 8 is a series of cross-sectional views I-IV depicting the operations in method 700. FIGS. 7 and 8 will be discussed in conjunction with one another.

In the illustrated embodiment, method 700 starts at operation 702 wherein substrate 118 is formed, for example, using a dual-damascene-like process. Thereby, substrate 118 can be shaped as to include a protruding seed 748. In some embodiments, seed 748 is 1 µm wide since later operations will end up magnifying its shape into protrusion 132. At operation 704, electrode 128 is formed on substrate 118, and passivation layer 130 is formed on substrate 118 and electrode 128. Also at operation 704, metal layer 740 is formed on passivation layer 130 and electrode 128. Metal layer 742 is formed on metal layer 740, and mask 744 is formed on metal layer 742. In some embodiments, metal layer 740 and/or metal layer 742 are copper or nickel. At operation 706, pore 746 is formed in mask 744 to expose metal layer 742. At operation 708, pad 126 is formed on metal layer 742 that includes protrusion 132. In some embodiments, pad is copper or nickel. At operation 710, mask 744 is removed, and at operation 712, metal layers 740 and 742 are etched away to form electrode pad 116.

Further Discussion of Some Exemplary Embodiments

The following are non-exclusive descriptions of some exemplary embodiments of the present disclosure.

A semiconductor device, according to an exemplary embodiment of this disclosure, among other possible things, includes: a first IC chip comprising: a first substrate; a spacer connected to the first substrate and including a plurality of holes, wherein at least one of the plurality of holes has a first shape; and a plurality of solder bumps positioned in the plurality of holes, respectively; and a second IC chip comprising: a second substrate; a plurality of electrode pads extending from the second substrate and connected to the plurality of solder bumps, respectively, wherein at least one of the plurality of electrode pads that corresponds to the at least one of the plurality of solder bumps has a second shape; wherein the first shape and the second shape are non-coextensive such that there is at least one gap between the first shape and the second shape when projected on each other.

The semiconductor device of the preceding paragraph can optionally include, additionally and/or alternatively, any one or more of the following features, configurations, and/or additional components:

A further embodiment of the foregoing semiconductor device, wherein the at least one of the plurality of electrode pads has a plus-sign shape and there are four gaps bordered by at least one of the plurality of electrode pads and the at least one of the plurality of holes.

A further embodiment of any of the foregoing semiconductor devices, wherein the at least one of the plurality of electrode pads includes a protrusion that extends towards the first IC chip.

A further embodiment of any of the foregoing semiconductor devices, wherein the spacer is a permanent photoresist layer.

A further embodiment of any of the foregoing semiconductor devices, wherein the at least one gap is configured to allow solder bump material to flow alongside the at least one of the plurality of electrode pads towards the second substrate.

A further embodiment of any of the foregoing semiconductor devices, wherein the first shape and the second shape are non-coextensive such that there is at least one discontinuous lap between the first shape and the second shape when projected on each other.

A semiconductor device, according to an exemplary embodiment of this disclosure, among other possible things, includes: a first IC chip comprising: a first substrate; a spacer connected to the first substrate and including a plurality of holes, wherein at least one of the plurality of holes has a first shape; and a plurality of solder bumps positioned in the plurality of holes, respectively; and a second IC chip comprising: a second substrate; a plurality of electrode pads extending from the second substrate and connected to the plurality of solder bumps, respectively, wherein at least one of the plurality of electrode pads that corresponds to the at least one of the plurality of solder bumps has a second shape; wherein the first shape and the second shape are non-coextensive such that there is at least one discontinuous lap between the first shape and the second shape when projected on each other.

The semiconductor device of the preceding paragraph can optionally include, additionally and/or alternatively, any one or more of the following features, configurations, and/or additional components:

A further embodiment of the foregoing semiconductor device, wherein the at least one of the plurality of electrode pads has a plus-sign shape and there are four discontinuous laps.

A further embodiment of any of the foregoing semiconductor devices, wherein the at least one of the plurality of electrode pads includes a protrusion that extends towards the first IC chip.

A further embodiment of any of the foregoing semiconductor devices, wherein the spacer is a permanent photoresist layer.

A further embodiment of any of the foregoing semiconductor devices, wherein the at least one discontinuous lap is configured to contact the spacer when the first IC chip and the second IC chip are forced together.

A further embodiment of any of the foregoing semiconductor devices, wherein the first shape and the second shape are non-coextensive such that there is at least one gap between the first shape and the second shape when projected on each other.

An IC chip, according to an exemplary embodiment of this disclosure, among other possible things, includes: a substrate; and a plurality of electrode pads extending from the substrate and configured to be connected to a plurality of solder bumps on another IC chip, respectively, wherein at least one of the plurality of electrode pads has a pad periphery that is configured to be non-coextensive with its corresponding one of the plurality of solder bumps that has a bump periphery such that: there is at least one gap between the pad periphery and the bump periphery when projected on each other; and there is at least one discontinuous lap between the pad periphery and the bump periphery when projected on each other.

The IC chip of the preceding paragraph can optionally include, additionally and/or alternatively, any one or more of the following features, configurations, and/or additional components:

A further embodiment of the foregoing IC chip, wherein the at least one of the plurality of electrode pads has a plus-sign shape and there are four gaps bordered by at least one of the plurality of electrode pads and the at least one of the plurality of solder bumps.

A further embodiment of any of the foregoing IC chips, wherein the at least one of the plurality of electrode pads includes a protrusion that extends towards the another IC chip.

A further embodiment of any of the foregoing IC chips, wherein the at least one discontinuous lap is configured to contact a spacer that surrounds each of the plurality of solder bumps when the IC chip is heated and forced against another IC chip.

A further embodiment of any of the foregoing IC chips, wherein the at least one gap is configured to allow solder bump material to flow alongside the at least one of the plurality of electrode pads towards another substrate.

A further embodiment of any of the foregoing IC chips, wherein each electrode pad comprises an electrode that is in direct contact with a pad.

A further embodiment of any of the foregoing IC chips, wherein each electrode includes a protruding seed.

A further embodiment of any of the foregoing IC chips, further comprising non-conductive paste atop the electrode pads.

A method of making a semiconductor device, the method, according to an exemplary embodiment of this disclosure, among other possible things, includes: forming a substrate, electrode, and a passivation layer of a first IC chip; forming a metal layer on the passivation layer and the electrode; forming a seed on the metal layer; and forming a cap on the seed to form a pad that is configured to be connected to a solder bump of a second IC chip, wherein a periphery of the pad is non-coextensive with a periphery of the solder bump such that: there is at least one gap between the periphery of the pad and the periphery of the solder bump when projected on each other; and there is at least one discontinuous lap between the periphery of the pad and the periphery of the solder bump when projected on each other.

The method of the preceding paragraph can optionally include, additionally and/or alternatively, any one or more of the following features, configurations, and/or additional components:

A further embodiment of the foregoing method, further comprising: forcing the pad against the solder bump of the second IC chip; and heating the solder bump to join the first IC chip and the second IC chip.

A further embodiment of any of the foregoing methods, wherein forming cap comprises forming the cap of the same material as the seed is formed of.

A method of making a semiconductor device, the method, according to an exemplary embodiment of this disclosure, among other possible things, includes: forming a substrate of a first IC chip, wherein the substrate includes a protruding seed; forming an electrode on the substrate, including the seed; forming a passivation layer on the substrate and on the electrode; forming a metal layer on the passivation layer and the electrode; and forming a pad on the electrode that is configured to be connected to a solder bump of a second IC chip, wherein a periphery of the pad is non-coextensive with a periphery of the solder bump such that: there is at least one gap between the periphery of the pad and the periphery of the solder bump when projected on each other; and there is at least one discontinuous lap between the periphery of the pad and the periphery of the solder bump when projected on each other.

The method of the preceding paragraph can optionally include, additionally and/or alternatively, any one or more of the following features, configurations, and/or additional components:

A further embodiment of the foregoing method, further comprising: forcing the pad against the solder bump of the second IC chip; and heating the solder bump to join the first IC chip and the second IC chip.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a first integrated circuit (IC) chip comprising:
      a first substrate;
      a spacer connected to the first substrate and including a plurality of holes, wherein at least one of the plurality of holes has a first shape; and
      a plurality of solder bumps positioned in the plurality of holes, respectively; and
   a second IC chip comprising:
      a second substrate;
      a plurality of electrode pads extending from the second substrate and connected to the plurality of solder bumps, respectively, wherein at least one of the plurality of electrode pads that corresponds to the at least one of the plurality of solder bumps has a second shape; and
      non-conductive paste located atop the plurality of electrode pads and the second substrate, and configured to be displaced by the plurality of solder bumps on the first IC chip,
      wherein the first shape and the second shape are non-coextensive such that there is at least one gap between the first shape and the second shape when projected on each other.

2. The semiconductor device of claim 1, wherein the at least one of the plurality of electrode pads has a plus-sign shape and there are four gaps bordered by at least one of the plurality of electrode pads and the at least one of the plurality of holes.

3. The semiconductor device of claim 1, wherein the at least one of the plurality of electrode pads includes a protrusion that extends towards the first IC chip.

4. The semiconductor device of claim 1, wherein the spacer is a permanent photoresist layer.

5. The semiconductor device of claim 1, wherein the at least one gap is configured to allow solder bump material to flow alongside the at least one of the plurality of electrode pads towards the second substrate.

6. The semiconductor device of claim 1, wherein the first shape and the second shape are non-coextensive such that there is at least one discontinuous lap between the first shape and the second shape when projected on each other.

7. A semiconductor device comprising:
a first integrated circuit (IC) chip comprising:
   a first substrate;
   a spacer connected to the first substrate and including a plurality of holes, wherein at least one of the plurality of holes has a first shape; and
   a plurality of solder bumps positioned in the plurality of holes, respectively; and
a second IC chip comprising:
   a second substrate;
   a plurality of electrode pads extending from the second substrate and connected to the plurality of solder bumps, respectively, wherein at least one of the plurality of electrode pads that corresponds to the at least one of the plurality of solder bumps has a second shape; and
   non-conductive paste located atop the plurality of electrode pads and the second substrate, and configured to be displaced by the plurality of solder bumps on the first IC chip,
   wherein the first shape and the second shape are non-coextensive such that there is at least one discontinuous lap between the first shape and the second shape when projected on each other.

8. The semiconductor device of claim 7, wherein the at least one of the plurality of electrode pads has a plus-sign shape and there are four discontinuous laps.

9. The semiconductor device of claim 7, wherein the at least one of the plurality of electrode pads includes a protrusion that extends towards the first IC chip.

10. The semiconductor device of claim 7, wherein the spacer is a permanent photoresist layer.

11. The semiconductor device of claim 7, wherein the at least one discontinuous lap is configured to contact the spacer when the first IC chip and the second IC chip are forced together.

12. The semiconductor device of claim 11, wherein the first shape and the second shape are non-coextensive such that there is at least one gap between the first shape and the second shape when projected on each other.

13. A semiconductor device comprising:
a first integrated circuit (IC) chip comprising:
   a substrate;
   a plurality of electrode pads extending from the substrate and configured to be connected to a plurality of solder bumps on a second IC chip, respectively, wherein at least one of the plurality of electrode pads has a pad periphery that is configured to be non-coextensive with its corresponding one of the plurality of solder bumps that has a bump periphery; and
   non-conductive paste located atop the plurality of electrode pads and the substrate, and configured to be displaced by the plurality of solder bumps on the second IC chip; and
the second IC chip,
wherein there is at least one gap between the pad periphery and the bump periphery when projected on each other, and there is at least one discontinuous lap between the pad periphery and the bump periphery when projected on each other.

14. The semiconductor device of claim 13, wherein the at least one of the plurality of electrode pads has a plus-sign shape and there are four gaps bordered by at least one of the plurality of electrode pads and the at least one of the plurality of solder bumps.

15. The semiconductor device of claim 13, wherein the at least one of the plurality of electrode pads includes a protrusion that extends towards the second IC chip.

16. The semiconductor device of claim 13, wherein the at least one discontinuous lap is configured to contact a spacer that surrounds each of the plurality of solder bumps when the first IC chip is heated and forced against the second IC chip.

17. The semiconductor device of claim 13, wherein the at least one gap is configured to allow solder bump material to flow alongside the at least one of the plurality of electrode pads towards another substrate.

18. The semiconductor device of claim 13, wherein each electrode pad comprises an electrode that is in direct contact with a pad.

19. The semiconductor device of claim 18, wherein each electrode includes a protruding seed.

20. A method of making a semiconductor device, the method comprising:
   forming a substrate, electrode, and a passivation layer of a first integrated circuit (IC) chip;
   forming a metal layer on the passivation layer and the electrode;
   forming a seed on the metal layer; and
   forming a cap on the seed to form a pad that is configured to be connected to a solder bump of a second IC chip, wherein a periphery of the pad is non-coextensive with a periphery of the solder bump such that:
      there is at least one gap between the periphery of the pad and the periphery of the solder bump when projected on each other; and
      there is at least one discontinuous lap between the periphery of the pad and the periphery of the solder bump when projected on each other.

21. The method of claim 20, further comprising:
   forcing the pad against the solder bump of the second IC chip; and
   heating the solder bump to join the first IC chip and the second IC chip.

22. The method of claim 20, wherein forming cap comprises forming the cap of a same material as the seed is formed of.

23. A method of making a semiconductor device, the method comprising:
   forming a substrate of a first integrated circuit (IC) chip, wherein the substrate includes a protruding seed;
   forming an electrode on the substrate, including the seed;
   forming a passivation layer on the substrate and on the electrode;
   forming a metal layer on the passivation layer and the electrode; and
   forming a pad on the electrode that is configured to be connected to a solder bump of a second IC chip, wherein a periphery of the pad is non-coextensive with a periphery of the solder bump such that:
      there is at least one gap between the periphery of the pad and the periphery of the solder bump when projected on each other; and
      there is at least one discontinuous lap between the periphery of the pad and the periphery of the solder bump when overlayed on each other.

24. The method of claim 23, further comprising:
forcing the pad against the solder bump of the second IC chip; and
heating the solder bump to join the first IC chip and the second IC chip.

* * * * *